(12) United States Patent
King et al.

(10) Patent No.: US 11,778,889 B2
(45) Date of Patent: Oct. 3, 2023

(54) HEIGHT MEASUREMENT AND CONTROL IN CONFINED SPACES FOR VAPOR DEPOSITION SYSTEM

(71) Applicant: Universal Display Corporation, Ewing, NJ (US)

(72) Inventors: Matthew King, Moorestown, NJ (US); Gregg Kottas, Ewing, NJ (US); Igor Kozin, Princeton, NJ (US); Gregory McGraw, Yardley, PA (US); William E. Quinn, Whitehouse Station, NJ (US)

(73) Assignee: Universal Display Corporation, Ewing, NJ (US)

(*) Notice: Subject to any disclaimer, the term of this patent is extended or adjusted under 35 U.S.C. 154(b) by 0 days.

(21) Appl. No.: 17/361,469

(22) Filed: Jun. 29, 2021

(65) Prior Publication Data

US 2022/0020972 A1  Jan. 20, 2022

Related U.S. Application Data

(60) Provisional application No. 63/054,150, filed on Jul. 20, 2020.

(51) Int. Cl.
*H01L 51/56* (2006.01)
*B05B 12/12* (2006.01)
(Continued)

(52) U.S. Cl.
CPC ........... *H10K 71/00* (2023.02); *B05B 12/124* (2013.01); *H10K 71/13* (2023.02)

(58) Field of Classification Search
None
See application file for complete search history.

(56) References Cited

U.S. PATENT DOCUMENTS

| | | |
|---|---|---|
| 4,769,292 A | 9/1988 | Tang |
| 4,810,966 A | 3/1989 | Schmall |
| (Continued) | | |

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al.Highly efficient phosphorescent emission from organic electroluminescent devices, Nature, vol. 395, pp. 151-154, 1998.
(Continued)

*Primary Examiner* — Jethro M. Pence
(74) *Attorney, Agent, or Firm* — Butzel Long

(57) ABSTRACT

Embodiments of the disclosed subject matter provide a device having a print head that includes a micronozzle array of depositors to deposit a material on a substrate. A reflective optical device may reflect a signal output by at least one optical sensor, and to reflect the signal from a surface of the substrate to the optical sensor. A processor may determine a distance between the optical sensor and the target surface of the substrate. The device may include one or more actuators coupled to the at least one print head to move the print head relative to an internal reference frame and adjust a position of the print head to the substrate. The sensor may be fixedly coupled with a mount to the internal reference frame. The print head may be configured to move independently of the optical sensor in at least one axis of linear or rotational motion.

16 Claims, 7 Drawing Sheets

(51) Int. Cl.
*H01L 51/00* (2006.01)
*H10K 71/00* (2023.01)
*H10K 71/13* (2023.01)

(56) References Cited

U.S. PATENT DOCUMENTS

| | | | |
|---|---|---|---|
| 5,247,190 A | 9/1993 | Friend | |
| 5,587,796 A * | 12/1996 | Rakitsch | B41F 33/0036 |
| | | | 356/445 |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,189,810 B1 * | 2/2001 | Nerushai | B05B 7/2472 |
| | | | 222/402.1 |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,582,875 B1 * | 6/2003 | Kay | B41J 2/47 |
| | | | 430/200 |
| 6,595,819 B1 | 7/2003 | Kitahara | |
| 7,279,704 B2 | 10/2007 | Walters | |
| 7,431,968 B1 | 10/2008 | Shtein | |
| 7,485,842 B2 * | 2/2009 | Bich | B43K 8/14 |
| | | | 250/227.13 |
| 7,968,146 B2 | 6/2011 | Wagner | |
| 8,197,900 B2 * | 6/2012 | Shinohara | B05C 5/0245 |
| | | | 118/325 |
| 8,920,562 B2 * | 12/2014 | Ikeda | C23C 14/26 |
| | | | 118/724 |
| 9,010,899 B2 * | 4/2015 | Harjee | B41J 2/04588 |
| | | | 347/14 |
| 9,045,657 B2 * | 6/2015 | Lewis | A61L 27/16 |
| 9,178,184 B2 * | 11/2015 | McGraw | C23C 14/12 |
| 9,224,952 B2 * | 12/2015 | Harjee | B41J 2/04581 |
| 9,352,561 B2 * | 5/2016 | Harjee | B41J 2/04588 |
| 9,537,119 B2 * | 1/2017 | Harjee | B41J 2/04593 |
| 9,700,908 B2 * | 7/2017 | Baker | B41J 2/04593 |
| 9,802,403 B2 * | 10/2017 | Harjee | B41J 2/07 |
| 9,832,428 B2 * | 11/2017 | Hauf | B41J 2/2142 |
| 9,923,165 B2 * | 3/2018 | Yoshida | H01L 51/5215 |
| 10,497,873 B2 * | 12/2019 | Lee | H01L 51/56 |
| 10,566,534 B2 * | 2/2020 | King | H01L 51/5206 |
| 10,654,272 B2 * | 5/2020 | McGraw | B41J 2/1433 |
| 10,686,133 B2 * | 6/2020 | Lee | B41J 2/2135 |
| 10,704,144 B2 * | 7/2020 | McGraw | C23C 14/24 |
| 10,784,470 B2 * | 9/2020 | Harjee | H01L 51/0005 |
| 10,784,472 B2 * | 9/2020 | Harjee | B41J 2/01 |
| 10,797,270 B2 * | 10/2020 | Harjee | H01L 51/0029 |
| 10,950,826 B2 * | 3/2021 | Harjee | B41J 2/04586 |
| 11,033,924 B2 * | 6/2021 | McGraw | C23C 16/30 |
| 11,108,027 B2 * | 8/2021 | Quinn | H01L 51/0029 |
| 11,121,320 B2 * | 9/2021 | Quinn | H01L 51/0004 |
| 11,121,322 B2 * | 9/2021 | King | H01L 51/5092 |
| 11,141,752 B2 * | 10/2021 | Baker | B41J 2/2132 |
| 11,167,303 B2 * | 11/2021 | Baker | H01L 51/56 |
| 11,233,226 B2 * | 1/2022 | Harjee | B41J 2/04593 |
| 11,489,146 B2 * | 11/2022 | Harjee | B41J 2/04588 |
| 2003/0230980 A1 | 12/2003 | Forrest | |
| 2004/0174116 A1 | 9/2004 | Lu | |
| 2004/0226929 A1 * | 11/2004 | Miura | B41M 3/006 |
| | | | 257/E21.174 |
| 2007/0052787 A1 * | 3/2007 | Miura | B41M 3/006 |
| | | | 257/E21.174 |
| 2008/0171142 A1 * | 7/2008 | Matsumoto | H01L 21/02271 |
| | | | 427/126.3 |
| 2008/0226496 A1 * | 9/2008 | Rivkine | A23L 3/26 |
| | | | 422/24 |
| 2009/0291197 A1 * | 11/2009 | Bartels | B23K 26/0869 |
| | | | 118/712 |
| 2012/0100313 A1 * | 4/2012 | Colby | B23K 26/40 |
| | | | 427/591 |
| 2013/0208036 A1 | 8/2013 | Forrest | |
| 2015/0099059 A1 * | 4/2015 | Harjee | B41J 2/04593 |
| | | | 427/8 |
| 2016/0356629 A1 | 12/2016 | Tiapkin | |
| 2017/0229663 A1 | 8/2017 | Tsai | |
| 2018/0146162 A1 * | 5/2018 | Hauf | B41J 2/2132 |
| 2018/0323373 A1 * | 11/2018 | Kersschot | C23C 14/24 |
| 2019/0218655 A1 * | 7/2019 | McGraw | C23C 14/04 |
| 2019/0221740 A1 * | 7/2019 | Quinn | H01L 51/0012 |
| 2020/0291521 A1 * | 9/2020 | McGraw | C23C 14/24 |
| 2021/0210734 A1 * | 7/2021 | Kim | H01L 51/0003 |
| 2021/0220857 A1 * | 7/2021 | Baker | B41J 2/04593 |
| 2021/0268536 A1 * | 9/2021 | McGraw | H01L 51/0013 |
| 2021/0343941 A1 * | 11/2021 | Forrest | H01L 51/0005 |
| 2021/0351385 A1 * | 11/2021 | King | H01L 51/56 |
| 2021/0367217 A1 * | 11/2021 | Quinn | H01L 51/56 |
| 2021/0384429 A1 * | 12/2021 | Quinn | H01L 51/0004 |
| 2022/0140296 A1 * | 5/2022 | Harjee | H01L 51/0012 |
| | | | 438/7 |
| 2022/0333230 A1 * | 10/2022 | King | H01L 51/56 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

Substrate Translates Normal to View

← Substrate Translates Relative to Head

HEIGHT MEASUREMENT AND CONTROL IN CONFINED SPACES FOR VAPOR DEPOSITION SYSTEM

CROSS-REFERENCE TO RELATED APPLICATIONS

This application claims priority to U.S. Patent Application Ser. No. 63/054,150, filed Jul. 20, 2020, the entire contents of which are incorporated herein by reference.

FIELD

The present invention relates to devices and techniques for fabricating organic emissive devices, such as organic light emitting diodes, and devices and techniques including the same. The devices for fabrication may make measurements closer to a printing zone and may provide thermal management for the sensors.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-S00 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-S00 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
| --- | --- |
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.3731, 0.6245]; [0.6270, 0.3725]; Interior: [0.3700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may include at least one print head that has a micronozzle array of depositors to deposit a material on a substrate. The device may include at least one optical sensor for the micronozzle array of depositors of each print head to output a signal. A reflective optical device may be disposed on the at least one print head to reflect the signal output by the at least one optical sensor, and to reflect the signal from a surface of the substrate to the optical sensor. The device may include a processor communicatively coupled to the at least one optical sensor to determine a distance between the at least one optical sensor and the target surface of the substrate based on an offset distance between the depositors and the substrate and based on the distance between the at least one optical sensor and the reflective optical device. One or more actuators may be coupled to the at least one print head to move the at least one print head relative to an internal reference frame that is decoupled from an external chamber, and adjust a position of the at least one print head to the substrate, where the processor may be communicatively coupled to the one or more actuators to move the at least one print head. At least one sensor of the device may be fixedly coupled with a mount to the internal reference frame, and the at least one print head may be configured to move independently of the at least one optical sensor in at least one axis of linear or rotational motion.

The reflective optical device may be a mirror, a prism, and/or a beamsplitter. The reflective optical device may be milled, ground, etched into, deposited on, or plated onto a portion of the at least one print head.

The device may include a cooling device thermally coupled to the mount to actively cool the mount of the at least one optical sensor. The mount may be an adjustable mount.

The processor may control the one or more actuators to move the at least one print head based on a first measured distance between the at least one sensor and the reflective optical device changes by a first predetermined amount, and/or a second measured distance between the reflective optical device and the substrate changes by a second predetermined amount.

The at least one actuator of the device may include a first actuator and a second actuator. The at least one print head may have a first side and a second side, and the first actuator may be coupled to the first side and the second actuator may be coupled to the second side. The first actuator and the second actuator may control the position of the at least one print head such that a fly height gap between the at least one print head and the substrate may be controlled on the first side and the second side of the at least one print head having the micronozzle array of depositors. The first actuator and the second actuator may provide the at least one print head with a linear degree of freedom along the substrate normal and a rotational degree of freedom in a plane of the substrate.

The at least one optical sensor of the device may include a first optical sensor and a second optical sensor, and the one or more actuators may include a first actuator and a second actuator. The first optical sensor may be disposed at a first end of the at least one print head, and the second optical sensor may be disposed at a second end of the at least one print head. The first optical sensor may determine a first displacement between the at least one print head and the substrate, and the second optical sensor may determine a second displacement between the at least one print head and the substrate. A first output of the first optical sensor may be used by the processor to control the first actuator, and a second output by the second optical sensor may be used by the processor to control the second actuator.

At least one optical sensor may include a plurality of sensors for each actuator of the one or more actuators. The processor may control each actuator based on a plurality of signals received from the respective plurality of sensors.

The at least one print head may include a plurality of first print heads and a plurality of second print heads that are arranged to form a print bar. The plurality of first print heads may be offset from the plurality of second set print heads to form a staggered line on the print bar.

The at least one print head may protrude through a temperature-controlled cold plate. The at least one optical sensor may be mounted on the temperature-controlled cold plate.

The device may include at least one thermally coupled heater to heat the at least one print head.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
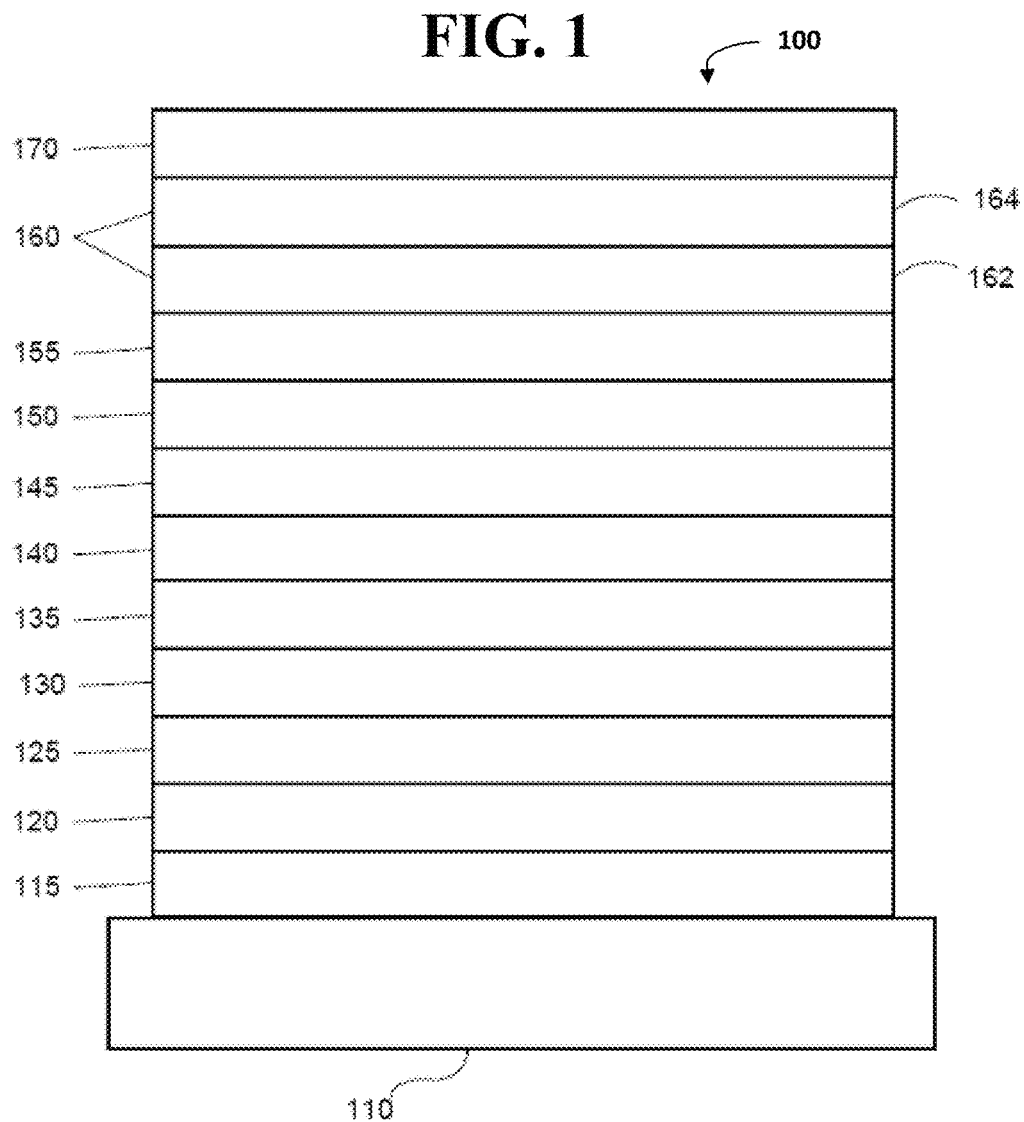
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
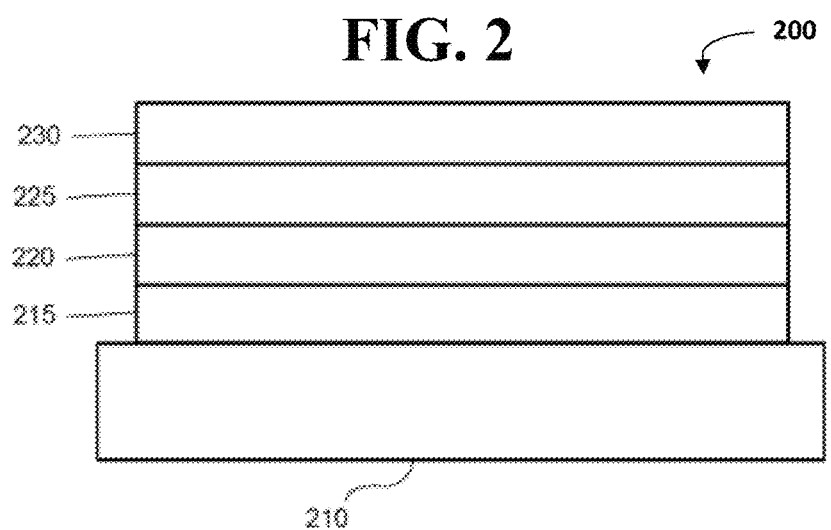
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Vapor jet deposition methods of manufacturing OLEDs may include material dispensing systems that may use micronozzle arrays arranged on a printing bar. The gap between nozzles and substrate may be adjusted to achieve a desired thickness, width, and/or uniformity of a thin film of deposition material generated as the substrate and nozzles move with respect to one another in a print pass. A displacement sensor may provide feedback to a controller and/or processor, which may adjust the height of the print bar to maintain a desired gap between nozzle and substrate. The offset between the sensor's mounting position and the nozzles may be a predetermined distance. The difference between this predetermined distance and the measurement of a distance between the nozzle and substrate may be the gap. As the substrate surface may not be flat on a scale relative to the desired print gap, the gap near the printing zone may be measured.

Organic vapor-jet printing (OVJP) is a hot printing process, and the surface of the substrate may move as it is subjected to the heat load from the hot vapor jets and the proximity to the hot print bar which may have a predetermined temperature range. Embodiments of the disclosed subject matter may maintain the gap between the micronozzle array and the substrate to a tighter tolerance (e.g., a predetermined tolerance range) when the sensors can measure the gap close to the printing zone. As the operating temperature range of the sensors may be less than the operating temperature range of the print bar, embodiments of the disclosed subject matter may thermally manage the sensor. Embodiments of the disclosed subject matter may make measurements closer to the printing zone and may provide thermal management for the sensors.

Embodiments of the disclosed subject matter may monitor the distance between a substrate and an array of micronozzle based depositors within a print head of an OVJP system. In some embodiments, different types of sensors may be used to determine the distance between the nozzle and surface, such as optical sensor and a capacitive sensor. In one embodiment, an array of optical displacement sensors (e.g., a plurality of sensors) may be used with each micronozzle array. An optical signal may be reflected orthogonally from a target surface on the substrate and may return to the sensor. A distance may be calculated by a processor from the sensor to the substrate surface. The processor may use this value, along with a predetermined offset between the mounting heights of the nozzles and sensor, to determine the nozzle-to-substrate gap. This gap may be referred to as the fly height.

Figure 3:
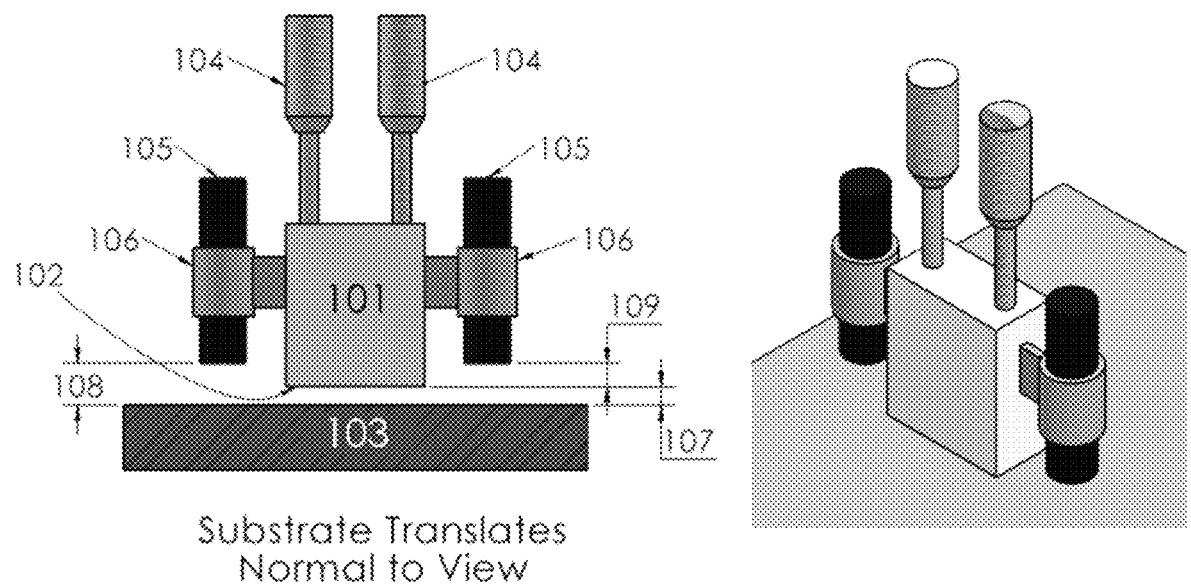
FIG. 3 shows front and isometric views of a device with vertically mounted sensors that are aligned with the printing plane.

FIG. 3 shows front and isometric views of a device with vertically mounted sensors that are aligned with the printing plane, as well as a mounting arrangement according to an embodiment of the disclosed subject matter. A print head 101 may include a micronozzle array of depositors 102 is positioned above a substrate 103. The position of the print head 101 may be controlled by a plurality of actuators 104 (e.g., a plurality of actuators) to adjust the height of each side of the print head 101. Optical sensors 105 may be rigidly connected to a first side and a second side of the print head 101 by standoffs 106. The distance 107 between the substrate 103 and depositor 102 is calculated from the difference between the measured distance from the sensors 105 to the substrate 108 and the offset distance 109 between each sensor 105 and the depositors 102. The sensors 105 may be mounted along the same plane as the depositor array 102 as shown in FIG. 3, or the sensors 105 may be leading and/or trailing the depositor array 102, as shown in FIG. 4.

Figure 4:
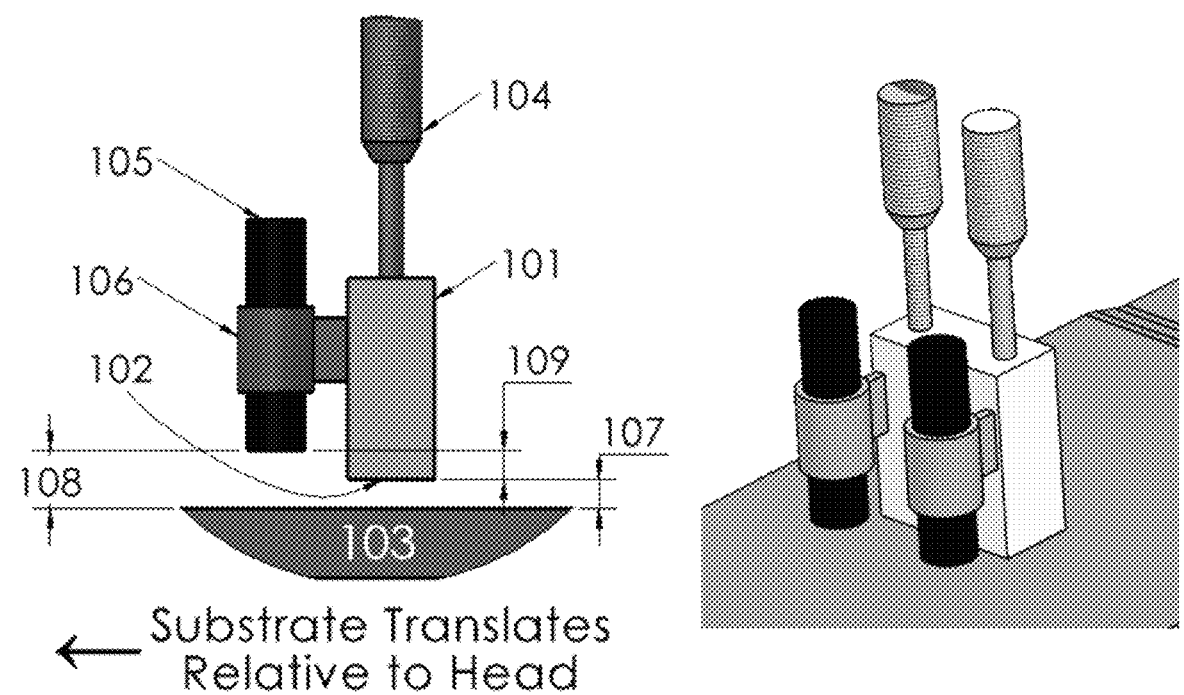
FIG. 4 shows front and isometric views of a device with vertically mounted sensors measuring the leading or trailing surface of the substrate from the print head.

FIGS. 3-4 show perpendicularly oriented views of the print head 101, with the substrate 103 translating normal to the page in FIG. 3 and along the horizontal direction in FIG. 4. The sensor 105 shown in FIGS. 3-4 may have a 2 mm diameter body, which may be the smallest diameter that may be used in the embodiments shown in FIGS. 3-4. The operating temperature of the print head 101 may be several hundred degrees Celsius higher than the maximum operating temperature of the sensor 105. The standoff 106 (i.e., rigid fixture) connecting the sensor 105 to the print head 101 may prevent overheating the sensor 105. In practice, the standoff 105 may separate the sensor 105 from the printing zone by more than 5 mm to thermally isolate the sensor 105. Measuring 5 mm away from the printing zone may introduce errors.

Figure 5:
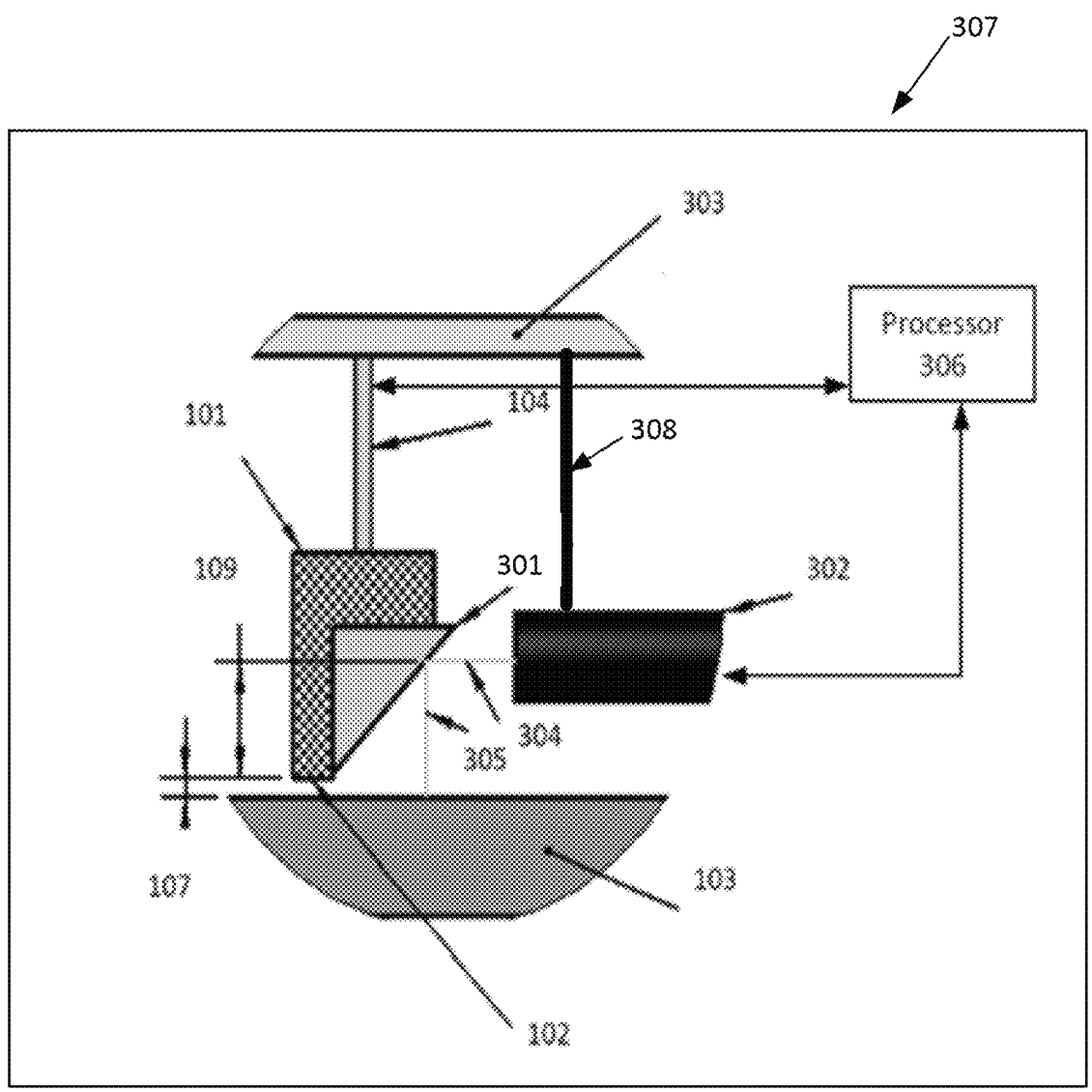
FIG. 5 shows a device with a horizontally mounted sensor and light deflection element arrangement according to an embodiment of the disclosed subject matter.

FIG. 5 shows a device with a horizontally mounted sensor and mirror arrangement according to an embodiment of the disclosed subject matter. In this embodiment, the device may include a reflective optical device 301 such as a mirror, prism, and/or beamsplitter, and a horizontally mounted sensor 302. The body of the sensor 302 may not be connected to the print head 101 by a standoff (e.g., standoff 106 shown in FIGS. 3-4) when the reflective optical device 301 is used. Instead, the sensor 302 may be fixed in position with respect to an internal reference frame 303, with the print head 101 moving vertically due to the motion of the actuators connecting the print head 101 to the fixed frame 303. Fixing the position of the optical sensor 302 probes may provide cooling and/or thermal management of the sensor 302, which improves accuracy and repeatability of the displacement measurement while reducing the chance of damaging the sensor 302. The measurement made in FIG. 5 by the sensor 302 may be the cumulative distance of both the distance 304 between the sensor 302 and the mirror reflective optical device 301 and the distance 305 between the reflective optical device 301 and the substrate 103. The offset distance between the nozzle height and the distance measured by the sensor 304 may be used by the processor 306 to perform the fly height calculation. The processor 306 may be communicatively coupled to the actuator 104 and the sensor 302. The processor may control the actuator 104 based on an output signal from the sensor 302.

Figures 6A, 6B, 6C:
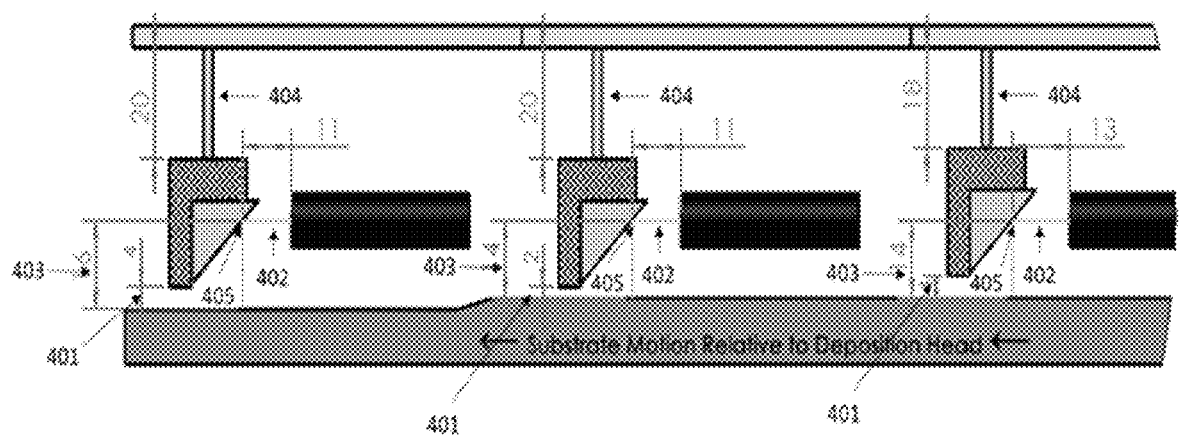
FIGS. 6A-6C show a response of the device to a change in the measured height of the substrate's surface according to embodiments of the disclosed subject matter.

FIGS. 6A-6C show, with arbitrary units, a response of a device to changes in the substrate surface position. FIG. 6A shows an initial configuration of the device, where the sensor measures 27 units, while the actual fly height 401 is 4 units. The path from the sensor to the mirror 402 is 11 units and the path from the mirror to the substrate 403 is 16 units. The sum of the paths may be the distance output by sensor.

The offset between the sensor and the nozzles may be the difference in these distances (i.e., 27−4=23 units). This offset may be used by the processor so that it reports the correct fly height.

When the device observes a −2 change in the measurement, as shown in FIG. 6B, the processor and/or sensor may control the actuator 404 to adjust the position of the print head upwards 2 units. FIG. 6C shown the print head after the adjustment in position. The measurement may be at the original 27 unit set point, while the distance between the depositors and the substrate may be at the original value of 4 units. The positions of the sensors may be fixed, so the point at which the sensor beam intersects the reflective optical device 405 may change as the print head moves. The measured distance may change as a function of both the change of the path length between the sensor and the reflective optical device, and the reflective optical device and the substrate. The path length between the substrate and may be unchanged in FIGS. 6B-6C. The path length between the sensor and the reflective optical device may lengthen by 2 units as the print head rises. So long as the total path length is held constant, the distance between the depositor array and the substrate may remain constant. If the print head encounters a depression instead of a rise, the reverse may occur. The path length between the reflective optical device and substrate may initially increase, and the print head may move downward in response. This downward motion may not change the optical path length between the print head and the substrate, but may shorten the path length between the reflective optical device and sensor until the target value is restored. The predetermined acquisitions rates of the sensors may be such that the response time for these changes may be measured in milliseconds.

Figure 7A:
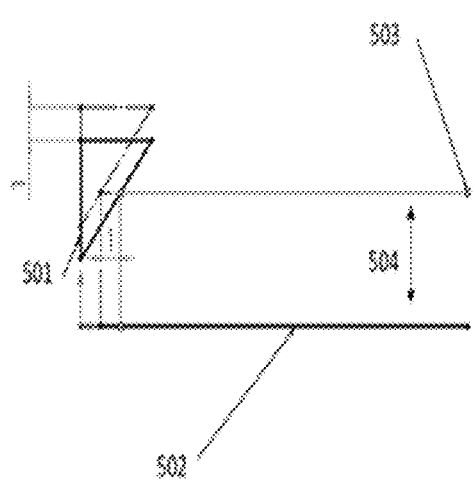
FIGS. 7A-7B show a comparison of the reflected measurement path for a horizontally mounted sensor with a 45 degree light deflection element (FIG. 7A), and a 10 degree sensor mounting with a 40 degree light deflection element (FIG. 7B) according to embodiments of the disclosed subject matter.
Figure 7B:
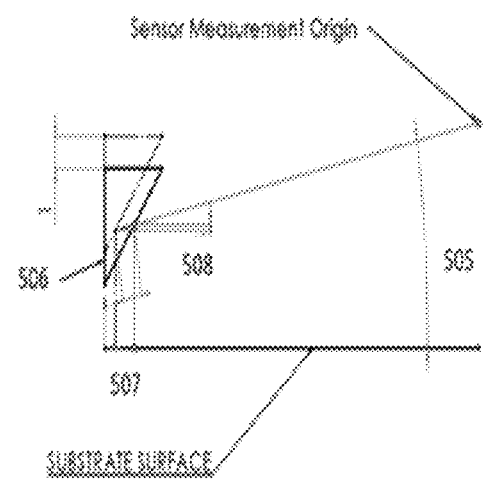

FIGS. 7A-7B show a comparison of the reflected measurement path for a horizontally mounted sensor with a 45 degree reflective optical device (shown in FIG. 7A), and a 10 degree sensor mounting with a 40 degree reflective optical device (FIG. 7B) according to embodiments of the disclosed subject matter.

Selection of a mounting location may be difficult when the sensor is horizontally mounted, as shown in FIG. 7A. For the measurement point to be as close to the printing zone as possible, the reflective optical device 501 may be located close to the depositor array, and therefore close to the substrate 502. The centerline 503 of the sensor may be horizontally mounted at a height 504 larger than its radius to avoid contacting the substrate 502, and the reflective optical device 501 may be placed closer to the substrate than that. FIG. 7B shows that by using a 10 degree mounting angle 505, paired with a 40 degree reflective optical device 501, the measuring point may be closer to the printing area. This configuration may keep the body of the sensor away from the hot print head assembly and substrate 502.

FIG. 7B shows that when the sensor is at any angle between horizontal and vertical, the processor may scale the measured signal of the sensor from a calibrated "zeroed" position. The units are normalized in FIG. 7B to show that with a change in fly height of 1 arbitrary unit (AU), the measured path length 507 may increase by 1 arbitrary unit before reaching the reflective optical device surface, and may have 0.174 arbitrary units less vertical travel 508. So, the sensor may have a 1−0.174=0.826 arbitrary unit change in the height.

Figure 8:
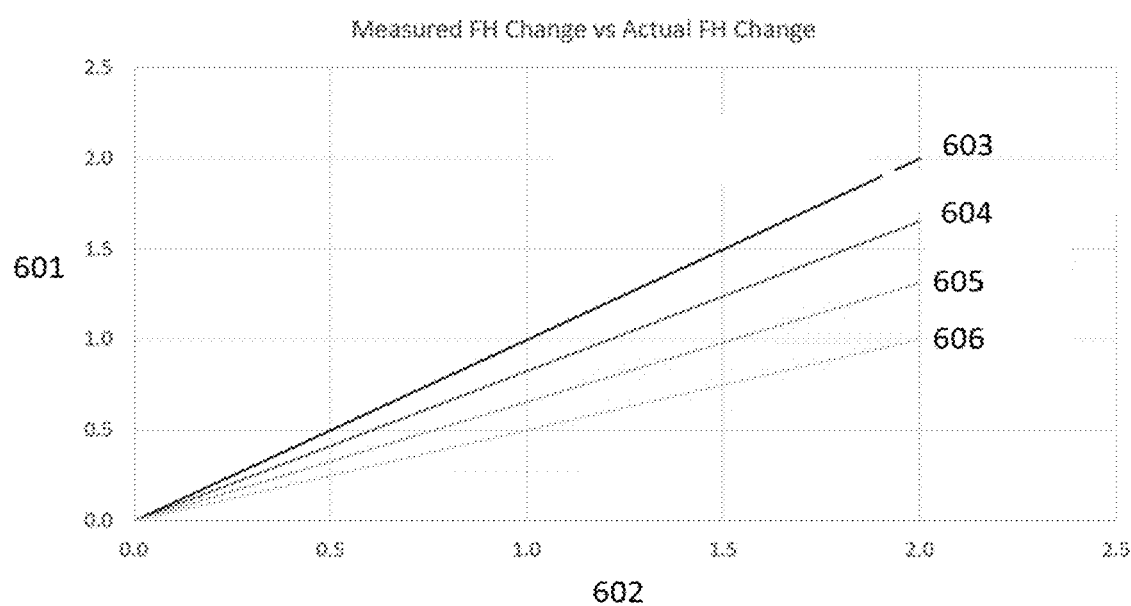
FIG. 8 shows a change in a measured distance versus an actual change in fly height at different sensor mounting angles and light deflection element parings according to embodiments of the disclosed subject matter.

FIG. 8 shows a change in a measured distance versus an actual change in fly height at different sensor mounting angles and reflective optical device parings according to embodiments of the disclosed subject matter. The vertical axis 601 shows the measured change in optical path length, and the horizontal axis 602 shows the actual change in fly height. Lines are shown for the cases of a sensor mounted in the plane of the substrate with a 45 degree reflective optical device (e.g., line 603), 10 degrees above the substrate surface with a 40 degree reflective optical device (e.g., line 604), 20 degrees above the substrate surface with a 35 degree reflective optical device (e.g., line 605), and 30 degrees above the substrate surface with a 30 degree reflective optical device (e.g., line 606). The scaling of an obliquely mounted sensor may reduce the measured change in displacement relative to the actual change in displacement. While the processor of the device may account for changes in scaling, this may still reduce the precision of displacement measurements from the sensor. In embodiments of the disclosed subject matter, the sensor may be mounted as close to horizontal or vertical to minimize these effects.

Figure 9:
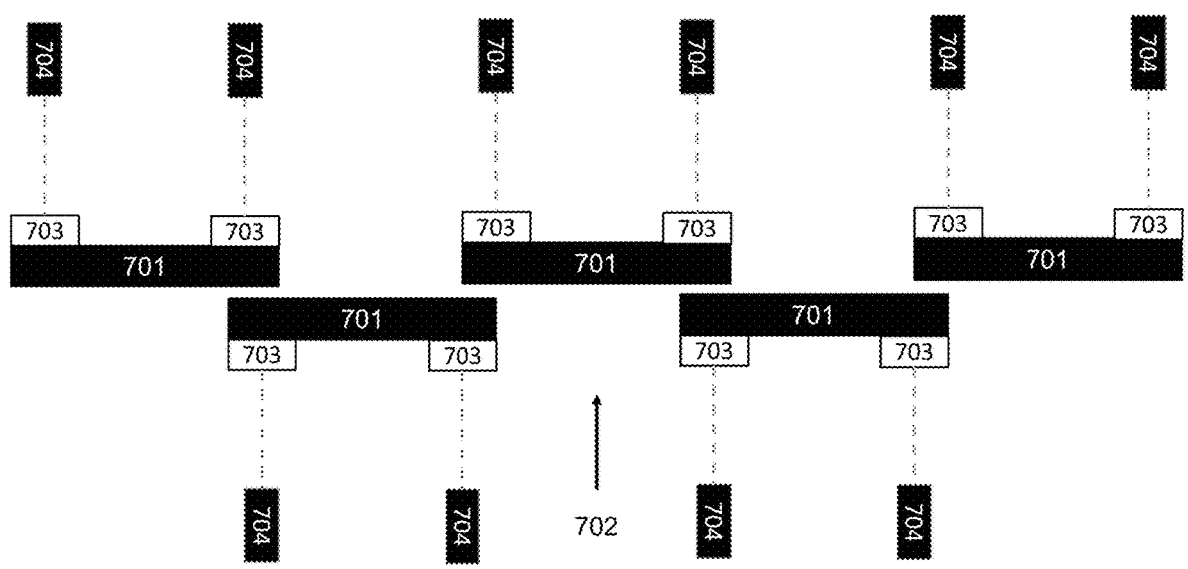
FIG. 9 shows a print bar having a plurality of print heads that include the measurement and control system according to an embodiment of the disclosed subject matter.

FIG. 9 shows a print bar that includes a plurality of print heads according to an embodiment of the disclosed subject matter. The print bar assembly of FIG. 9 is viewed looking downward onto the substrate. A plurality of print heads 701 may be arranged into ranks (e.g., two ranks, as shown in FIG. 9) to form a staggered line that eliminate gaps in coverage on a substrate moving beneath the print heads 701 in a direction 702 perpendicular to the line of the print heads 701. Each print head 701 may have a reflective optical device 703 on each end of its outside surface. An optical sensor 704 may be aligned with each reflective optical device 703 to track the displacement between the depositors at the bottom of the print head 701 and the substrate at its location. This information may be provided to a processor, which may adjust the print bar using actuators to maintain a constant fly height between each print head 701 in the print bar and the substrate.

Embodiments of the disclosed subject matter improve the reliability of the measurement by moving the measurement point closer to the substrate, which was a previously inaccessible region. The sensor may be mounted farther from a hot assembly which includes the print head, which significantly reduces the heat load to the sensor and its mount. Embodiments of the disclosed subject matter improve the lifetime of the sensor and maintain a steady, reliable measurement. Devices having the features of the embodiments of the disclosed subject matter may be scaled because the sensors are not mounted along the same nozzle plane, such as shown in FIG. 3. Instead, they may be mounted above the leading or trailing substrate surface.

Embodiments of the disclosed subject matter described above in connection with FIGS. 5-9 may include device having at least one print head (e.g., print head 101 shown in FIG. 5) that includes a micronozzle array of depositors (e.g., depositors 102 shown in FIG. 5) to deposit a material on a substrate (e.g., substrate 103 shown in FIG. 5; substrate 502 shown in FIGS. 7A-7B). Some embodiments of the disclosed subject matter may include at least one thermally coupled heater to heat the at least one print head. The device may have at least one optical sensor (e.g., sensor 302 shown in FIG. 5; sensor 704 shown in FIG. 9) for the micronozzle array of depositors of each print head to output a signal.

A reflective optical device (e.g., reflective optical device 301 shown in FIG. 5; reflective optical device 501 shown in FIGS. 7A-7B; reflective optical device 703 shown in FIG. 9) may disposed on the at least one print head to reflect the signal output by the at least one optical sensor, and to reflect the signal from a surface of the substrate to the sensor. The reflective optical device may be a mirror, a prism, or a beamsplitter. The reflective optical device may be milled, ground, etched into, deposited on, or plated onto a portion of the at least one print head.

A processor (e.g., processor 306 shown in FIG. 5) may be communicatively coupled to the at least one optical sensor to determine a distance between the at least one optical sensor and the target surface of the substrate based on an offset distance between the depositors and the substrate and based on the distance between the at least one optical sensor and the reflective optical device. The processor may be communicatively coupled to the actuator to control the movement of the actuator based on a signal received from the optical sensor.

One or more actuators (e.g., actuators 104 shown in FIG. 5) may be coupled to the at least one print head to move the at least one print head relative to an internal reference frame (e.g., internal reference frame 303 shown in FIG. 5) that is decoupled from an external chamber (e.g., external chamber 307 shown in FIG. 5). The internal reference frame may be configured so that it does not flex. The external chamber may enclose and/or surround the print head, sensor, reflective optical device, actuator, substrate, and the internal reference frame. The at least one sensor may be fixedly coupled with a mount (e.g., mount 308 shown in FIG. 5) to the internal reference frame. The at least one print head may be configured to move independently of the at least one optical sensor in at least one axis of linear or rotational motion. For example, the actuator may move the at least one print head independently of the optical sensor.

The processor may be configured to control the one or more actuators to move the at least one print head based on a first measured distance between the at least one sensor and the reflective optical device changes by a first predetermined amount, and/or a second measured distance between the reflective optical device and the substrate changes by a second predetermined amount.

The at least one actuator may include a first actuator and a second actuator. The at least one print head may have a first side and a second side, and the first actuator may be coupled to the first side and the second actuator may be coupled to the second side. The first actuator and the second actuator may control the position of the at least one print head such that a fly height gap between the at least one print head and the substrate is controlled on the first side and the second side of the at least one print head having the micronozzle array of depositors. The first actuator and the second actuator may provide the at least one print head with a linear degree of freedom along the substrate normal and a rotational degree of freedom in a plane of the substrate.

In some embodiments, a cooling device may be thermally coupled to the mount of the sensor. The cooling device may actively cool the mount of the at least one optical sensor. The sensor mount may be an adjustable mount, which may be configured to change the orientation of the sensor.

In some embodiments, the at least one optical sensor may include a first optical sensor and a second optical sensor, and the one or more actuators comprise a first actuator and a second actuator. The first optical sensor may be disposed at a first end of the at least one print head, and the second optical sensor is disposed at a second end of the at least one print head. The first optical sensor may determine a first displacement between the at least one print head and the substrate, and the second optical sensor determines a second displacement between the at least one print head and the substrate.

A first output of the first optical sensor may be used by the processor to control the first actuator, and a second output by the second optical sensor is used by the processor to control the second actuator.

In some embodiments, at least one optical sensor may include a plurality of sensors for each actuator of the one or more actuators. The processor may control each actuator based on a plurality of signals received from the respective plurality of sensors.

The at least one print head may include a plurality of first print heads and a plurality of second print heads that are arranged to form a print bar. The plurality of first print heads may be offset from the plurality of second set print heads to form a staggered line on the print bar.

In some embodiments, at least one print head may protrude through a temperature-controlled cold plate. The at least one optical sensor may be mounted on the temperature-controlled cold plate.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   at least one print head that includes a micronozzle array of depositors to deposit a material on a substrate;
   at least one optical sensor for the micronozzle array of depositors of each of the at least one print head to output a signal;
   a reflective optical device disposed on the at least one print head to reflect the signal output by the at least one optical sensor, and to reflect the signal from a surface of the substrate to the at least one optical sensor;
   a processor communicatively coupled to the at least one optical sensor to determine a distance between the at least one optical sensor and the surface of the substrate based on an offset distance between the micronozzle array of depositors and the substrate and based on a distance between the at least one optical sensor and the reflective optical device; and
   one or more actuators coupled to the at least one print head to move the at least one print head relative to an internal reference frame that is decoupled from an external chamber, and adjust a position of the at least one print head relative to the substrate, wherein the processor is communicatively coupled to the one or more actuators to move the at least one print head,
   wherein the at least one optical sensor is fixedly coupled with a mount to the internal reference frame, and wherein the at least one print head is configured to move independently of the at least one optical sensor in at least one axis of linear or rotational motion.

2. The device of claim 1, wherein the reflective optical device is at least one selected from the group consisting of: a mirror, a prism, and a beamsplitter.

3. The device of claim 1, wherein the reflective optical device is milled, ground, etched into, deposited on, or plated onto a portion of the at least one print head.

4. The device of claim 1, further comprising:
   a cooling device thermally coupled to the mount to actively cool the mount of the at least one optical sensor.

5. The device of claim 1, wherein the mount comprises an adjustable mount.

6. The device of claim 1, wherein the processor controls the one or more actuators to move the at least one print head based on at least one selected from the group consisting of: a first measured distance between the at least one optical sensor and the reflective optical device changes by a first predetermined amount; and a second measured distance between the reflective optical device and the substrate changes by a second predetermined amount.

7. The device of claim 1, wherein the at least one actuator includes a first actuator and a second actuator,
   wherein the at least one print head has a first side and a second side, and the first actuator is coupled to the first side and the second actuator is coupled to the second side, and
   wherein the first actuator and the second actuator control the position of the at least one print head such that a fly height gap between the at least one print head and the substrate is controlled on the first side and the second side of the at least one print head having the micronozzle array of depositors, wherein the first actuator and the second actuator provide the at least one print head with a linear degree of freedom along the substrate normal and a rotational degree of freedom in a plane of the substrate.

8. The device of claim 1, wherein the at least one optical sensor comprises a first optical sensor and a second optical sensor, and the one or more actuators comprise a first actuator and a second actuator,
   wherein the first optical sensor is disposed at a first end of the at least one print head, and the second optical sensor is disposed at a second end of the at least one print head,
   wherein the first optical sensor determines a first displacement between the at least one print head and the substrate, and the second optical sensor determines a second displacement between the at least one print head and the substrate, and
   wherein a first output of the first optical sensor is used by the processor to control the first actuator, and a second output by the second optical sensor is used by the processor to control the second actuator.

9. The device of claim 1, wherein at least one optical sensor comprises a plurality of sensors for each actuator of the one or more actuators, and wherein the processor controls each actuator based on a plurality of signals received from the respective plurality of sensors.

10. The device of claim 1, wherein the at least one print head includes a plurality of first print heads and a plurality of second print heads that are arranged to form a print bar.

11. The device of claim 10, wherein the plurality of first print heads are offset from the plurality of second set print heads to form a staggered line on the print bar.

12. The device of claim 1, wherein the at least one print head protrudes through a temperature-controlled cold plate.

13. The device of claim 12, wherein the at least one optical sensor is mounted on the temperature-controlled cold plate.

14. The device of claim 1, further comprising:
    at least one thermally coupled heater to heat the at least one print head.

15. A consumer electronic device to be manufactured by a device comprising:
- at least one print head that includes a micronozzle array of depositors to deposit a material on a substrate;
- at least one optical sensor for the micronozzle array of depositors of each of the at least one print head to output a signal;
- a reflective optical device disposed on the at least one print head to reflect the signal output by the at least one optical sensor, and to reflect the signal from a surface of the substrate to the at least one optical sensor;
- a processor communicatively coupled to the at least one optical sensor to determine a distance between the at least one optical sensor and the surface of the substrate based on an offset distance between the micronozzle array of depositors and the substrate and based on a distance between the at least one optical sensor and the reflective optical device; and
- one or more actuators coupled to the at least one print head to move the at least one print head relative to an internal reference frame that is decoupled from an external chamber, and adjust a position of the at least one print head relative to the substrate, wherein the processor is communicatively coupled to the one or more actuators to move the at least one print head,
- wherein the at least one optical sensor is fixedly coupled with a mount to the internal reference frame, and wherein the at least one print head is configured to move independently of the at least one optical sensor in at least one axis of linear or rotational motion.

16. The consumer electronic device of claim 15, wherein the consumer electronic device to be manufactured by the device is at least one type selected from the group consisting of: a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

* * * * *